US010416550B2

(12) United States Patent
Johnson et al.

(10) Patent No.: US 10,416,550 B2
(45) Date of Patent: Sep. 17, 2019

(54) METHOD TO REDUCE LINE WAVINESS

(71) Applicant: Applied Materials, Inc., Santa Clara, CA (US)

(72) Inventors: Joseph R. Johnson, Redwood City, CA (US); Christopher Dennis Bencher, Cupertino, CA (US); Thomas L. Laidig, Richmond, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/936,385

(22) Filed: Mar. 26, 2018

(65) Prior Publication Data

US 2018/0217491 A1 Aug. 2, 2018

Related U.S. Application Data

(63) Continuation of application No. 15/705,771, filed on Sep. 15, 2017, now Pat. No. 9,927,696, which is a continuation of application No. 15/188,193, filed on Jun. 21, 2016, now Pat. No. 9,791,786.

(60) Provisional application No. 62/320,164, filed on Apr. 8, 2016.

(51) Int. Cl.
*G03F 1/38* (2012.01)
*G03F 7/20* (2006.01)
*G03F 1/70* (2012.01)

(52) U.S. Cl.
CPC ............... *G03F 1/38* (2013.01); *G03F 1/70* (2013.01); *G03F 7/70291* (2013.01); *G03F 7/70433* (2013.01); *G03F 7/70508* (2013.01)

(58) Field of Classification Search
CPC .......... G03F 1/38; G03F 1/70; G03F 7/70291; G03F 7/70433; G03F 7/70508

USPC ..................................................... 430/5, 30
See application file for complete search history.

(56) References Cited

U.S. PATENT DOCUMENTS 9,791,786 B1 * 10/2017 Johnson ............. G03F 7/70291
9,927,696 B2 * 3/2018 Johnson ............. G03F 7/70291
2009/0066942 A1 3/2009 Mangan et al.

FOREIGN PATENT DOCUMENTS

| CN | 103235489 A | 8/2013 |
| CN | 103424996 A | 12/2013 |
| EP | 1467254 A1 | 10/2004 |
| EP | 2133755 A2 | 12/2009 |
| WO | 2011-076500 A1 | 6/2011 |

OTHER PUBLICATIONS

International Search Report and Written Opinion in related application PCT/US2017/024781 dated Jul. 11, 2017.

* cited by examiner

*Primary Examiner* — Christopher G Young
(74) *Attorney, Agent, or Firm* — Patterson + Sheridan LLP

(57) ABSTRACT

Embodiments disclosed herein relate to an exposure pattern alteration software application which manipulates exposure polygons having lines with angles substantially close to angles of symmetry of a hex close pack arrangement, which suffer from long jogs. Long jogs present themselves as high edge placement error regions. As such, the exposure pattern alteration software application provides for line wave reduction by serrating polygon edges at affected angles to reduce edge placement errors during maskless lithography patterning in a manufacturing process.

20 Claims, 10 Drawing Sheets

METHOD TO REDUCE LINE WAVINESS

CROSS-REFERENCE TO RELATED APPLICATIONS

This application is a continuation of co-pending U.S. patent application Ser. No. 15/705,771, filed Sep. 15, 2017, which is a continuation of Ser. No. 15/188,193, filed Jun. 21, 2016, now U.S. Pat. No. 9,791,786, patented Oct. 17, 2017 which both claim priority to U.S. Provisional Patent Application No. 62/320,164, filed Apr. 8, 2016, the entirety of which all are hereby incorporated by reference.

BACKGROUND

Field

Embodiments of the present disclosure generally relate to the field of maskless lithography. More specifically, embodiments provided herein relate to a system and method for performing maskless digital lithography manufacturing processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices to consumers at the prices demanded by consumers, new apparatuses, approaches, and systems are needed to precisely and cost-effectively create patterns on substrates, such as large area substrates.

As the foregoing illustrates, there is a need for an improved technique and devices to precisely and cost-effectively create the needed patterns.

SUMMARY

The present disclosure generally relates to a line wave reduction software application platform which provides an exposure pattern with serration alterations applied thereon to reduce edge placement errors during maskless lithography patterning in a manufacturing process. In one embodiment, a method for altering an exposure pattern is disclosed. The method includes determining a packing factor of a shot distribution, determining angles of symmetry of the packing factor, and determining a serration selection of the angles of symmetry. Determining the serration selection includes determining a mirror shot pitch of the packing factor, determining a serration amplitude of the angles of symmetry, and determining a serration pitch of the angles of symmetry. The method also includes applying the serration selection to the exposure pattern close to the angles of symmetry.

In another embodiment, a computer system for altering an exposure pattern is disclosed. The computer system for altering the exposure pattern includes a processor and a memory storing instructions that, when executed by the processor, cause the computer system to determine a packing factor of a shot distribution, determine angles of symmetry of the packing factor, and determine a serration selection of the angles of symmetry. Determining the serration selection includes determining a mirror shot pitch of the packing factor, determining a serration amplitude of the angles of symmetry, and determining a serration pitch of the angles of symmetry. The memory may also store instructions that, when executed by the processor, cause the computer system to apply the serration selection to the exposure pattern close to the angles of symmetry.

In yet another embodiment, a non-transitory computer-readable medium, storing instructions that, when executed by a processor, cause a computer system to alter an exposure pattern, is disclosed. The processor may perform the operations of determining a packing factor of a shot distribution, determining angles of symmetry of the packing factor, and determining a serration selection of the angles of symmetry. Determining the serration selection includes determining a mirror shot pitch of the packing factor, determining a serration amplitude of the angles of symmetry, and determining a serration pitch of the angles of symmetry. The processor may also perform the operation of applying the serration selection to the exposure pattern close to the angles of symmetry.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein relate to an exposure pattern alteration software application which manipulates exposure polygons having lines with angles substantially close to angles of symmetry of a hex close pack arrangement, which suffer from long jogs. Long jogs present themselves as regions of high edge placement error. As such, the exposure pattern alteration software application provides for line wave reduction by serrating polygon edges at affected angles to reduce edge placement errors during maskless lithography patterning in a manufacturing process.

The term "user" as used herein includes, for example, a person or entity that owns a computing device or wireless device; a person or entity that operates or utilizes a computing device or a wireless device; or a person or entity that is otherwise associated with a computing device or a wireless device. It is contemplated that the term "user" is not intended to be limiting and may include various examples beyond those described.

Figure 1:
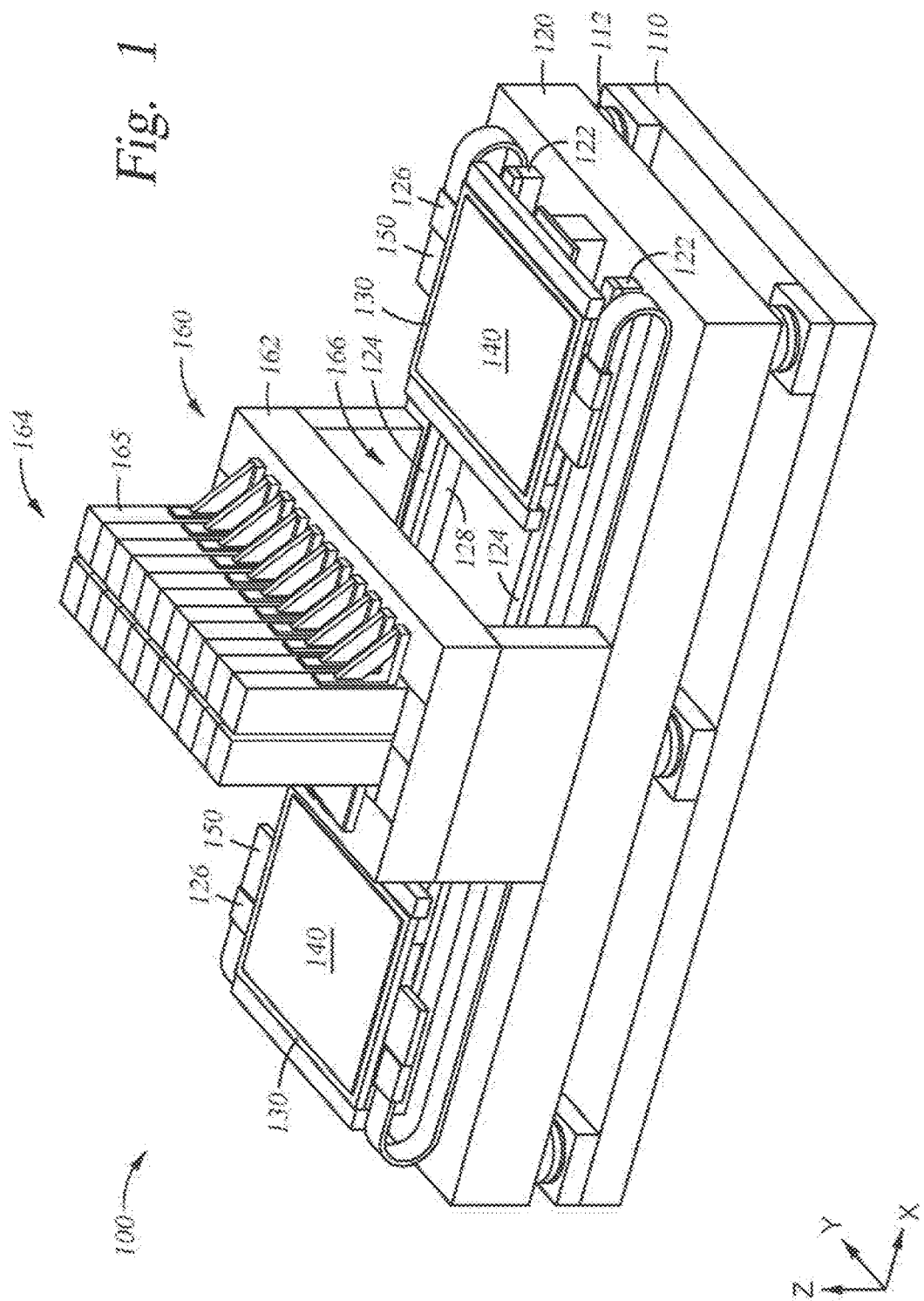
FIG. 1 is a perspective view of a system that may benefit from embodiments disclosed herein.

FIG. 1 is a perspective view of a system 100 that may benefit from embodiments disclosed herein. The system 100 includes a base frame 110, a slab 120, two or more stages 130, and a processing apparatus 160. In certain embodiments, one stage 130 may be used. The base frame 110 may rest on the floor of a fabrication facility and may support the slab 120. Passive air isolators 112 may be positioned between the base frame 110 and the slab 120. The slab 120 may be a monolithic piece of granite, and the two or more stages 130 may be disposed on the slab 120. A substrate 140 may be supported by each of the two or more stages 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto the stage 130.

The substrate 140 may, for example, be made of glass and be used as part of a flat panel display. In other embodiments, the substrate 140 may be made of other materials, for example, quartz. Furthermore, in other embodiments, the substrate 140 may be a polymer substrate. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to a photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of supports 122 may be disposed on the slab 120, and the slab 120 and the pair of supports 122 may be a single piece of material. The pair of tracks 124 may be supported by the pair of the supports 122, and the two or more stages 130 may move along the tracks 124 in the X-direction. In one embodiment, the pair of tracks 124 is a pair of parallel magnetic channels. As shown, each track 124 of the pair of tracks 124 is linear. In other embodiments, the track 124 may have a non-linear shape. An encoder 126 may be coupled to each stage 130 in order to provide location information to a controller 702 (See FIG. 7).

The processing apparatus 160 may include a support 162 and a processing unit 164. The support 162 may be disposed on the slab 120 and may include an opening 166 for the two or more stages 130 to pass under the processing unit 164. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems (shown in FIG. 2) disposed in a case 165. The processing apparatus 160 may be utilized to perform maskless direct patterning. During operation, one of the two or more stages 130 moves in the X-direction from a loading position, as shown in FIG. 1, to a processing position. The processing position may refer to one or more positions of the stage 130 as the stage 130 passes under the processing unit 164. During operation, the two or more stages 130 may be lifted by a plurality of air bearings (not shown) and may move along the pair of tracks 124 from the loading position to the processing position. A plurality of vertical guide air bearings (not shown) may be coupled to each stage 130 and positioned adjacent an inner wall 128 of each support 122 in order to stabilize the movement of the stage 130. Each of the two or more stages 130 may also move in the Y-direction by moving along a track 150 for processing and/or indexing the substrate 140. Each stage 130 may also include a motor coil (not shown) for moving the stage 130 along the tracks 124. The two or more stages 130 and the processing apparatus 160 may be enclosed by an enclosure (not shown) in order to provide temperature and pressure control.

Figure 2:
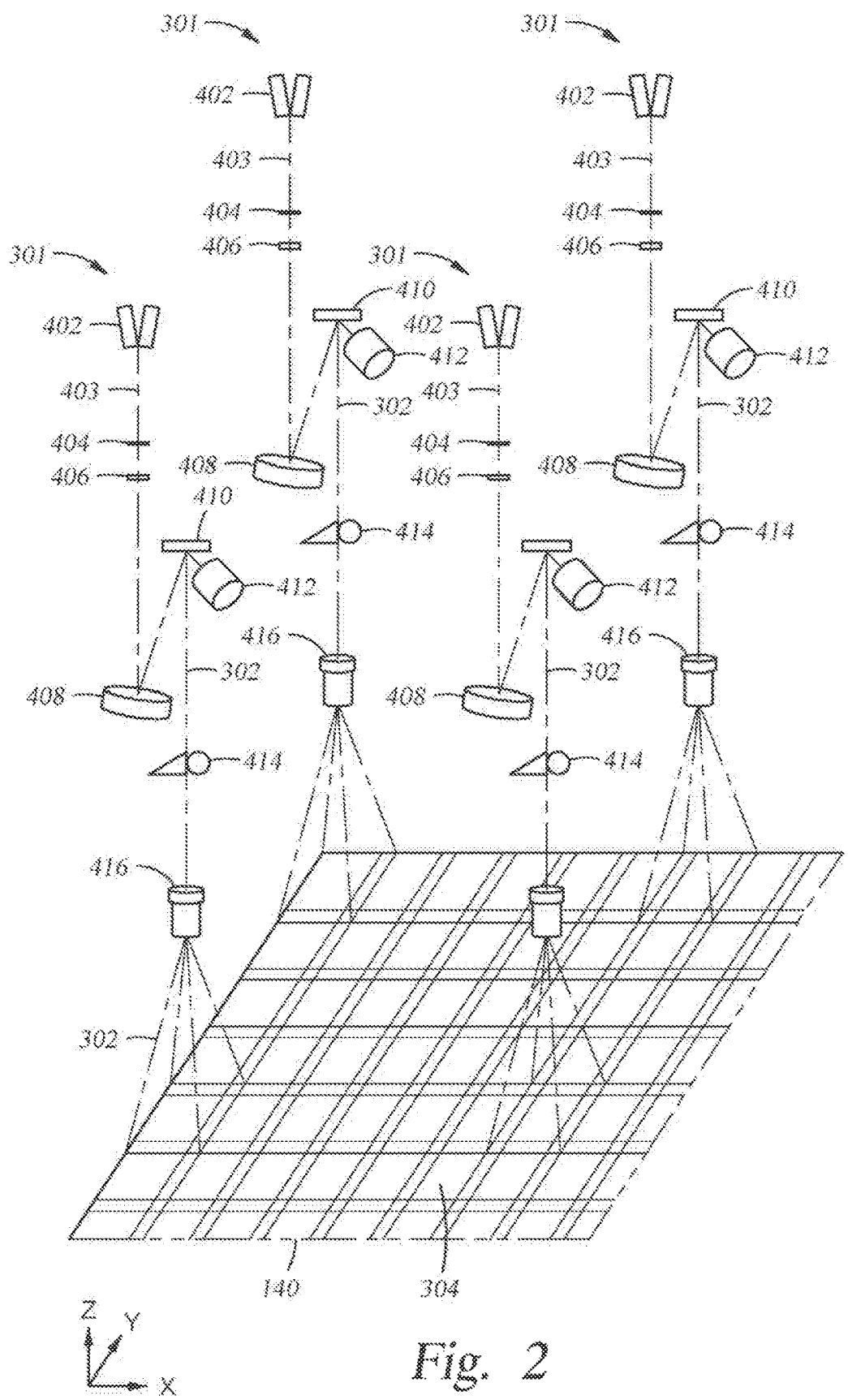
FIG. 2 is a perspective schematic view of a plurality of image projection systems, according to one embodiment.

FIG. 2 is a perspective schematic view of a plurality of image projection systems 301 according to one embodiment. As shown in FIG. 2, each image projection system 301 produces a plurality of write beams 302 onto a surface 304 of the substrate 140. As the substrate 140 moves in the X-direction and Y-direction, the entire surface 304 may be patterned by the write beams 302. The number of the image projection systems 301 may vary based on the size of the substrate 140 and/or the speed of stage 130. In one embodiment, there are 22 image projection systems 164 in the processing apparatus 160.

As further shown in FIG. 2, the image projection system 301 may include a light source 402, an aperture 404, a lens 406, a mirror 408, a DMD 410, a light dump 412, a camera 414, and a projection lens 416. The light source 402 may be a light emitting diode (LED) or a laser, and the light source 402 may be capable of producing a light having predetermined wavelength. In one embodiment, the predetermined wavelength is in the blue or near ultraviolet (UV) range, such as less than about 450 nm. The mirror 408 may be a spherical mirror. The projection lens 416 may be a 10× objective lens. The DMD 410 may include a plurality of mirrors, and the number of mirrors may correspond to the resolution of the projected image. In one embodiment, the DMD 410 includes 1920×1080 mirrors.

During operation, a beam 403 having a predetermined wavelength, such as a wavelength in the blue range, is produced by the light source 402. The beam 403 is reflected to the DMD 410 by the mirror 408. The DMD 410 includes a plurality of mirrors that may be controlled individually, and each mirror of the plurality of mirrors of the DMD 410 may be at "on" position or "off" position, based on the mask data provided to the DMD 410 by the controller (not shown). When the beam 403 reaches the mirrors of the DMD 410, the mirrors that are at "on" position reflect the beam 403, i.e., forming the plurality of write beams 302, to the projection lens 416. The projection lens 416 then projects the write beams 302 to the surface 304 of the substrate 140. The mirrors that are at "off" position reflect the beam 403 to the light dump 412 instead of the surface 304 of the substrate 140.

In one embodiment, the DMD 410 may have two mirrors. Each mirror may be disposed on a tilting mechanism, which may be disposed on a memory cell. The memory cell may be a CMOS SRAM. During operation, each mirror is controlled by loading the mask data into the memory cell. The mask data electrostatically controls the tilting of the mirror in a binary fashion. When the mirror is in a reset mode or without power applied, it may be set to a flat position, not corresponding to any binary number. Zero in binary may correspond to an "off" position, which means the mirror is tilted at −10 degrees, −12 degrees, or any other feasibly negative tilting degree. One in binary may correspond to an "on" position, which means the mirror is tilted at +10 degrees, +12 degrees, or any other feasibly positive tilting degree.

Figure 3:
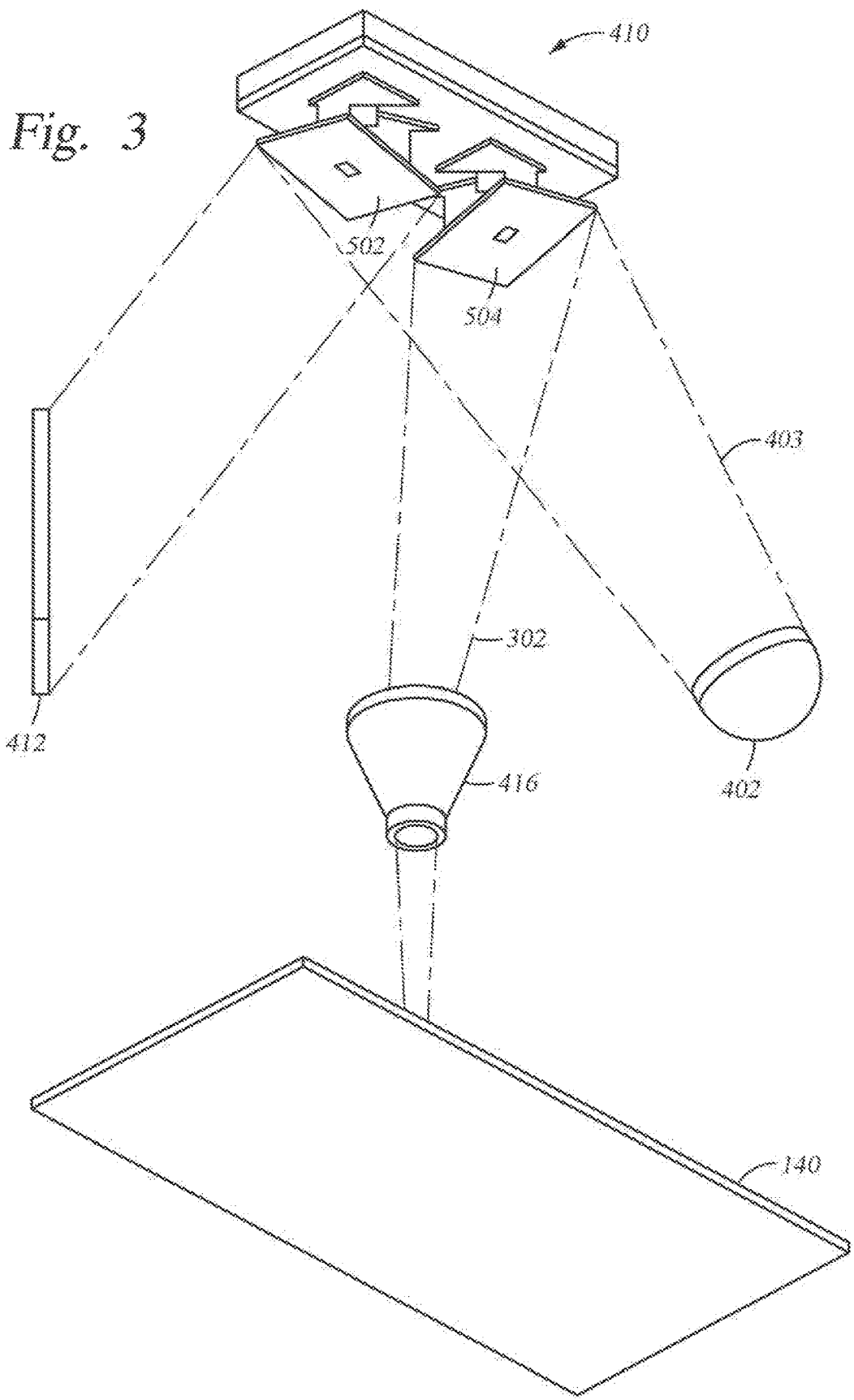
FIG. 3 schematically illustrates a beam being reflected by the two mirrors of the DMD, according to one embodiment.

FIG. 3 schematically illustrates the beam 403 being reflected by two mirrors 502, 504 of the DMD 410. As shown, the mirror 502, which is at "off" position, reflects the beam 403 generated from the light source 402 to the light dump 412. The mirror 504, which is at "on" position, forms the write beam 302 by reflecting the beam 403 to the projection lens 416.

Each system 100 may contain any number of image projection systems 301, and the number of image projection systems 301 may vary by system. In one embodiment there are 84 image projection systems 301. Each image projection system 301 may comprise 40 diodes, or any number of diodes. A problem arises when trying to maintain a large number of diodes as higher power is needed to handle such large numbers of diodes. One solution may be to order the diodes in series; however, a need exists for the detection of a non-functioning diode when organized in a series as described below.

Figure 4:
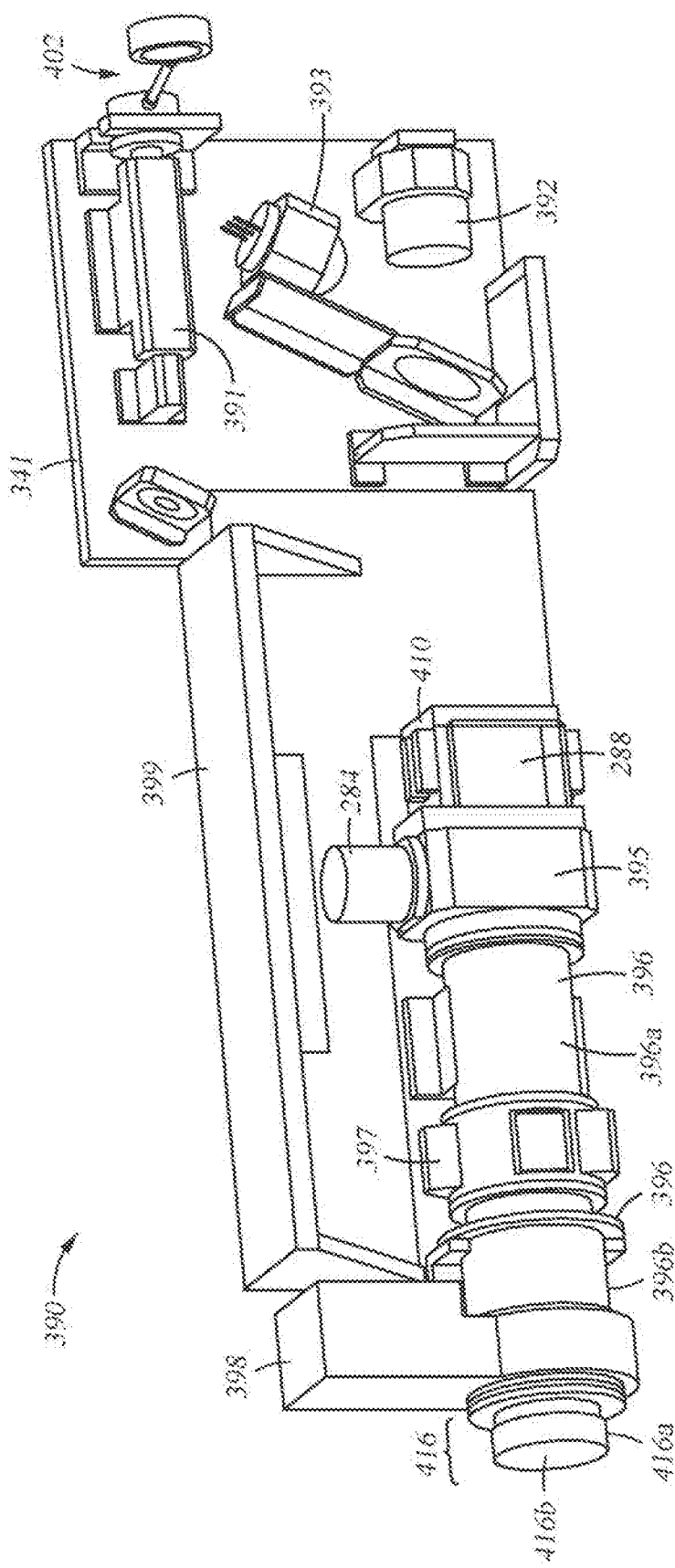
FIG. 4 is a perspective view of an image projection apparatus, according to one embodiment.

FIG. 4 is a perspective view of an image projection apparatus 390 according to one embodiment. The image projection apparatus 390 is used to focus light to a certain spot on a vertical plane of a substrate 140 and to ultimately project an image onto that substrate 140. The image projection apparatus 390 includes two subsystems. The image projection apparatus 390 includes an illumination system and a projection system. The illumination system includes at least a light pipe 391 and a white light illumination device 392. The projection system includes at least a DMD 410, a frustrated prism assembly 288, a beamsplitter 395, one or more projection optics 396a, 396b, a distortion compensator 397, a focus motor 398 and a projection lens 416 (discussed supra). The projection lens 416 includes a focus group 416a and a window 416b.

Light is introduced to the image projection apparatus 390 from the light source 402. The light source 402 may be an actinic light source. For example, the light source 402 may be a bundle of fibers, each fiber containing one laser. In one embodiment, the light source 402 may be a bundle of about 100 fibers. The bundle of fibers may be illuminated by laser diodes. The light source 402 is coupled to the light pipe (or kaleido) 391. In one embodiment, the light source 402 is coupled to the light pipe 391 through a combiner, which combines each of the fibers of the bundle.

Once light from the light source 402 enters into the light pipe 391, the light bounces around inside the light pipe 391 such that the light is homogenized and uniform when it exits the light pipe 391. The light may bounce in the light pipe 391 up to six or seven times. In other words, the light goes through six to seven total internal reflections within the light pipe 391, which results in the output of uniform light.

The image projection apparatus 390 may optionally include various reflective surfaces (not labeled). The various reflective surfaces capture some of the light traveling through the image projection apparatus 390. In one embodiment, the various reflective surfaces may capture some light and then help direct the light to a light level sensor 393 so that the laser level may be monitored.

The white light illumination device 392 projects broadband visible light, which has been homogenized by the light pipe 391, into the projection system of image projection apparatus 390. Specifically, the white light illumination device 392 directs the light to the frustrated prism assembly. The actinic and broad-band light sources may be turned on and off independently of one another.

The frustrated prism assembly 288 functions to filter the light that will be projected onto the surface of the substrate 140. The light beam is separated into light that will be projected onto the substrate 140 and light that will not. Use of the frustrated prism assembly 288 results in minimum energy loss because the total internal reflected light goes out. The frustrated prism assembly 288 is coupled to a beamsplitter 395.

A DMD 410 is included as part of the frustrated cube assembly. The DMD 410 is the imaging device of the image projection apparatus 390. Use of the DMD 410 and frustrated prism assembly 288 help to minimize the footprint of each image projection apparatus 390 by keeping the direction of the flow of illumination roughly normal to the substrate 140 all the way from the light source 402 that generates the exposure illumination to the substrate focal plane.

The beamsplitter 395 is used to further extract light for alignment. More specifically, the beamsplitter 395 is used to split the light into two or more separate beams. The beamsplitter 395 is coupled to the one or more projection optics 396. Two projection optics 396a, 396b are shown in FIG. 4.

In one embodiment, a focus sensor and camera 284 is attached to the beamsplitter 395. The focus sensor and camera 284 may be configured to monitor various aspects of the imaging quality of the image projection apparatus 390, including, but not limited to, through lens focus and alignment, as well as mirror tilt angle variation. Additionally, the focus sensor and camera 284 may show the image, which is going to be projected onto the substrate 140. In further embodiments, the focus sensor and camera 284 may be used to capture images on the substrate 140 and make a comparison between those images. In other words, the focus sensor and camera 284 may be used to perform inspection functions.

Together the projection optics 396, the distortion compensator 397, the focus motor 398, and the projection lens 416 prepare for and ultimately project the image from the DMD 410 onto the substrate 140. Projection optics 396a is coupled to the distortion compensator 397. The distortion compensator 397 is coupled to projection optics 396b, which is coupled to the focus motor 398. The focus motor 398 is coupled to the projection lens 416. The projection lens 416 includes a focus group 416a and a window 416b. The focus group 416a is coupled to the window 416b. The window 416b may be replaceable.

The light pipe 391 and white light illumination device 392 are coupled to a first mounting plate 341. Additionally, in embodiments including additional various reflective surfaces (not labeled) and a light level sensor 393, the various reflective surfaces and the light level sensor 393 may also be coupled to the first mounting plate 341.

The frustrated prism assembly 288, beamsplitter 395, one or more projection optics 396a, 396b and distortion compensator 397 are coupled to a second mounting plate 399. The first mounting plate 341 and the second mounting plate 399 are planar, which allows for precise alignment of the aforementioned components of the image projection apparatus 390. In other words, light travels through the image projection apparatus 390 along a single optical axis. This precise alignment along a single optical axis results in an apparatus that is compact. For example, the image projection apparatus 390 may have a thickness of between about 80 mm and about 100 mm.

In some embodiments, other hardware such as a microlens or a liquid crystal may be utilized instead of or in combination with the DMD 410 to control the light in an array fashion.

Figure 5:
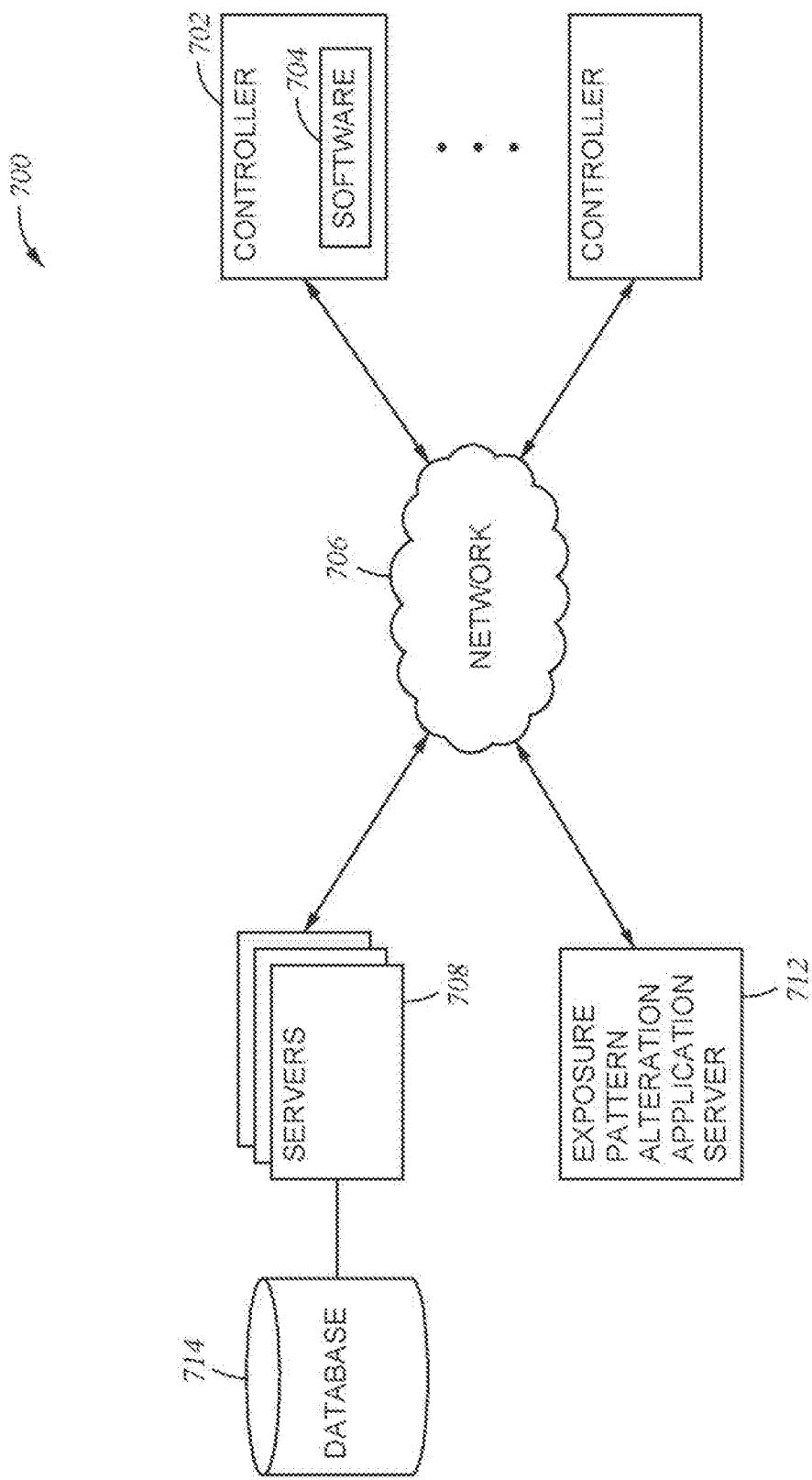
FIG. 5 illustrates a computer system for providing an exposure pattern alteration application for creating serration alterations for exposure patterns to reduce edge placement errors of the exposure patterns during maskless lithography, according to one embodiment.

FIG. 5 illustrates a computing system 700 configured to provide an exposure pattern alteration software application platform in which embodiments of the disclosure may be practiced. As shown, the computing system 700 may include a plurality of servers 708, an exposure pattern alteration application server 712, and a plurality of controllers (i.e., computers, personal computers, mobile/wireless devices) 702 (only two of which are shown for clarity), each connected to a communications network 706 (for example, the Internet). The servers 708 may communicate with the database 714 via a local connection (for example, a Storage Area Network (SAN) or Network Attached Storage (NAS)) or over the Internet. The servers 708 are configured to either directly access data included in the database 714 or to interface with a database manager that is configured to manage data included within the database 714.

Each controller 702 may include conventional components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 708 and the exposure pattern alteration application server 712 may include a processor and a system memory (not shown), and may be configured to manage content stored in database 714 using, for example, relational database software and/or a file system. The servers 708 may be programmed to communicate with one another, the controllers 702, and the exposure pattern alteration application server 712 using a network protocol such as, for example, the TCP/IP protocol. The exposure pattern alteration application server 712 may communicate directly with the controllers 702 through the communications network 706. The controllers 702 are programmed to execute software 704, such as programs and/or other software applications, and access applications managed by servers 708.

In the embodiments described below, users may respectively operate the controllers 702 that may be connected to the servers 708 over the communications network 706. Pages, images, data, documents, and the like may be displayed to a user via the controllers 702. Information and images may be displayed through a display device and/or a graphical user interface in communication with the controller 702.

It is noted that the controller 702 may be a personal computer, laptop mobile computing device, smart phone, video game console, home digital media player, network-connected television, set top box, and/or other computing devices having components suitable for communicating with the communications network 706 and/or the necessary applications or software. The controller 702 may also execute other software applications configured to receive content and information from the exposure pattern alteration application server 712.

Figure 6:
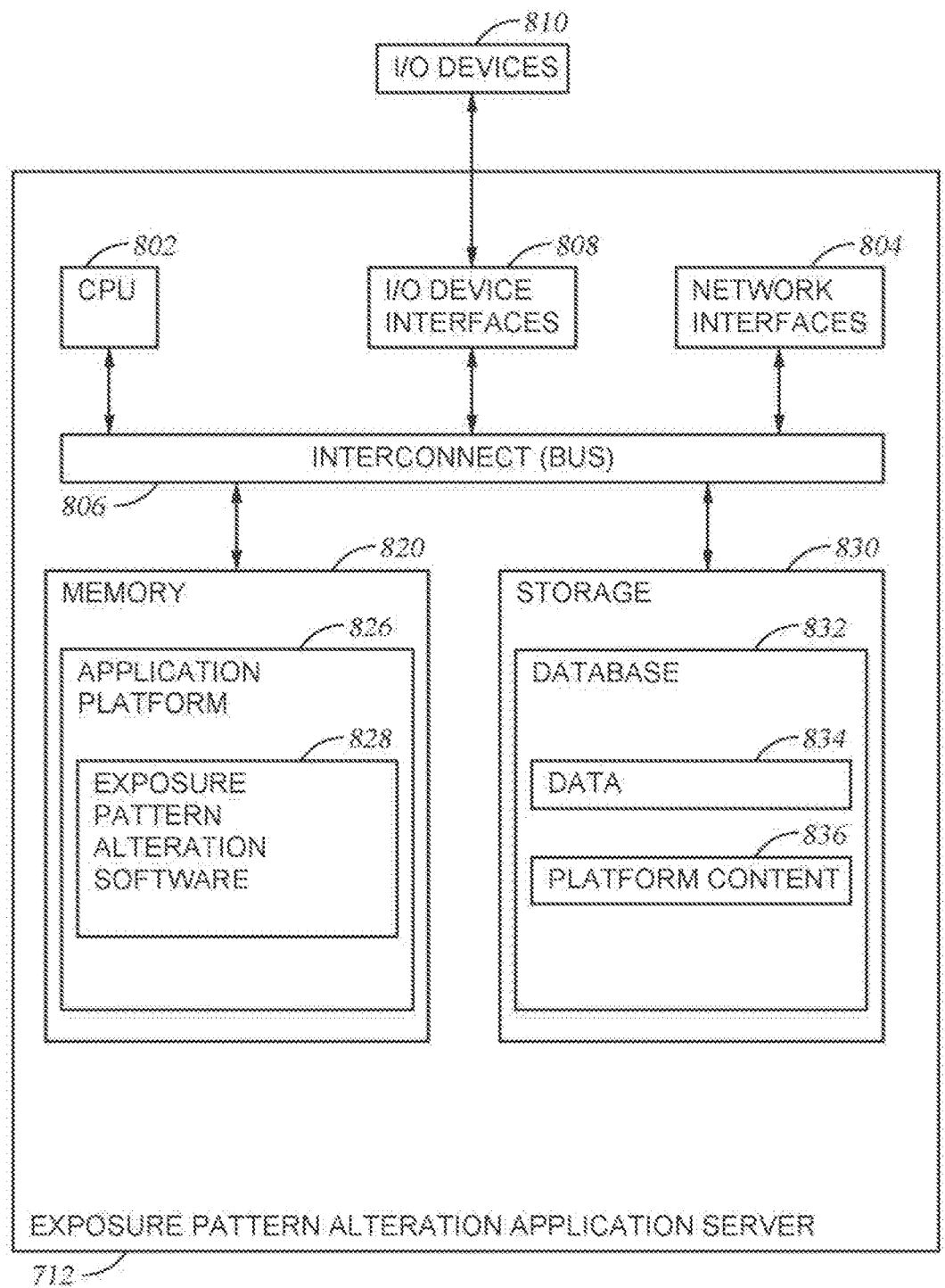
FIG. 6 illustrates a more detailed view of a server of FIG. 5, according to one embodiment.

FIG. 6 illustrates a more detailed view of the exposure pattern alteration application server 712 of FIG. 5. The exposure pattern alteration application server 712 includes, without limitation, a central processing unit (CPU) 802, a network interface 804, memory 820, and storage 830 communicating via an interconnect 806. The exposure pattern alteration application server 712 may also include I/O device interfaces 808 connecting I/O devices 810 (for example, keyboard, video, mouse, audio, touchscreen, etc.). The exposure pattern alteration application server 712 may further include the network interface 804 configured to transmit data via the communications network 706.

The CPU 802 retrieves and executes programming instructions stored in the memory 820 and generally controls and coordinates operations of other system components. Similarly, the CPU 802 stores and retrieves application data residing in the memory 820. The CPU 802 is included to be representative of a single CPU, multiple CPU's, a single CPU having multiple processing cores, and the like. The interconnect 806 is used to transmit programming instructions and application data between the CPU 802, I/O device interfaces 808, storage 830, network interfaces 804, and memory 820.

The memory 820 is generally included to be representative of a random access memory and, in operation, stores software applications and data for use by the CPU 802. Although shown as a single unit, the storage 830 may be a combination of fixed and/or removable storage devices, such as fixed disk drives, floppy disk drives, hard disk drives, flash memory storage drives, tape drives, removable memory cards, CD-ROM, DVD-ROM, Blu-Ray, HD-DVD, optical storage, network attached storage (NAS), cloud storage, or a storage area-network (SAN) configured to store non-volatile data.

The memory 820 may store instructions and logic for executing an application platform 826 which may include exposure pattern alteration software 828. The storage 830 may include a database 832 configured to store data 834 and associated application platform content 836. The database 832 may be any type of storage device.

Network computers are another type of computer system that can be used in conjunction with the disclosures provided herein. Network computers do not usually include a hard disk or other mass storage, and the executable programs are loaded from a network connection into the memory 820 for execution by the CPU 802. A typical computer system will usually include at least a processor, memory, and an interconnect coupling the memory to the processor.

Figure 7:
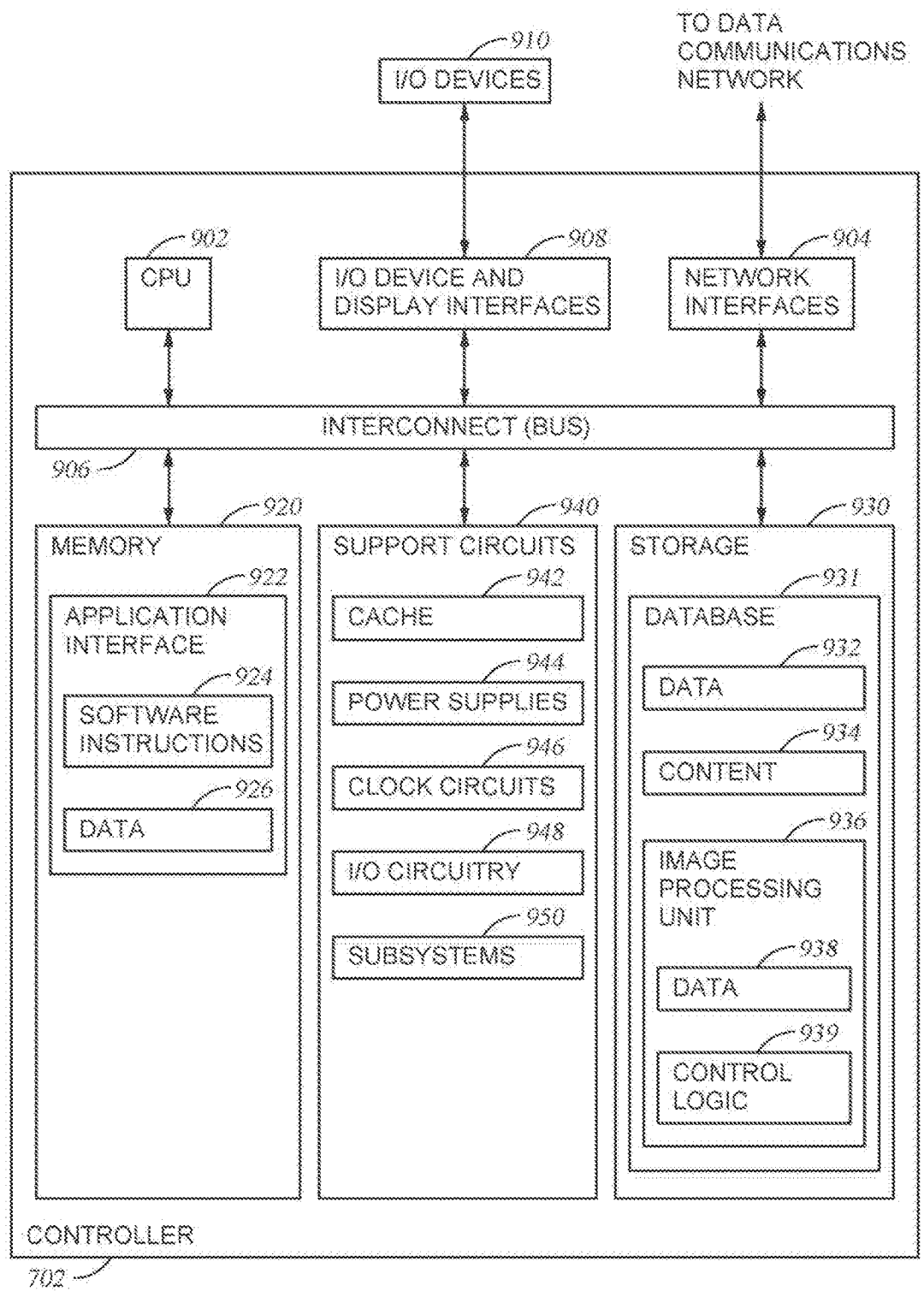
FIG. 7 illustrates a controller computing system used to access an exposure pattern alternation software application for creating serration alterations for exposure patterns to reduce edge placement errors of the exposure patterns during maskless lithography, according to one embodiment.

FIG. 7 illustrates a controller 702 used to access the exposure pattern alteration application server 712 and retrieve or display data associated with the application platform 826. The controller 702 may include, without limitation, a central processing unit (CPU) 902, a network interface 904, an interconnect 906, a memory 920, storage 930, and support circuits 940. The controller 702 may also include an I/O device interface 908 connecting I/O devices 910 (for example, keyboard, display, touchscreen, and mouse devices) to the controller 702.

Like CPU 802, CPU 902 is included to be representative of a single CPU, multiple CPU's, a single CPU having multiple processing cores, etc., and the memory 920 is generally included to be representative of a random access memory. The interconnect 906 may be used to transmit programming instructions and application data between the CPU 902, I/O device interfaces 908, storage 930, network interface 904, and memory 920. The network interface 904 may be configured to transmit data via the communications network 706, for example, to transfer content from the exposure pattern alteration application server 712. Storage 930, such as a hard disk drive or solid-state storage drive (SSD), may store non-volatile data. The storage 930 may contain a database 931. The database 931 may contain data 932 and other content 934. In some embodiments, the database 931 may further include an image processing unit 936. The image processing unit may include data 938 and/or control logic 939. Illustratively, the memory 920 may include an application interface 922, which itself may display software instructions 924, and/or store or display data 926. The application interface 922 may provide one or more software applications which allow the controller 702 to access data and other content hosted by the exposure pattern alteration application server 712.

The controller 702 may be coupled to or in communication with one or more of the processing apparatus 160, the stages 130, and the encoder 126. The processing apparatus 160 and the stages 130 may provide information to the controller 702 regarding the substrate processing and the substrate aligning. For example, the processing apparatus 160 may provide information to the controller 702 to alert the controller that substrate processing has been completed. The encoder 126 may provide location information to the controller 702, and the location information is then used to control the stages 130 and the processing apparatus 160.

The controller 702 may include a central processing unit (CPU) 902, memory 920, and support circuits 940 (or I/O 908). The CPU 902 may be one of any form of computer processors that are used in industrial settings for controlling various processes and hardware (e.g., pattern generators, motors, and other hardware) and monitor the processes (e.g., processing time and substrate position). The memory 920, as shown in FIG. 7, is connected to the CPU 902, and may be one or more of a readily available memory, such as random access memory (RAM), read only memory (ROM), floppy disk, hard disk, or any other form of digital storage, local or remote. Software instructions and data can be coded and stored within the memory for instructing the CPU 902. The support circuits 940 are also connected to the CPU 902 for supporting the processor in a conventional manner. The support circuits 940 may include conventional cache 942, power supplies 944, clock circuits 946, input/output circuitry 948, subsystems 950, and the like. A program (or computer instructions) readable by the controller 702 determines which tasks are performable on a substrate. The program may be software readable by the controller 702 and may include code to monitor and control, for example, the processing time and substrate position.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the necessary purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or it may prove convenient to construct a more specialized apparatus to perform the necessary method operations. The structure for a variety of these systems will appear from the description above. In addition, the present examples are not described with reference to any particular programming language, and various examples may thus be implemented using a variety of programming languages.

As described in greater detail within, embodiments of the disclosure provide a software application through which line wave defects of exposure polygons are corrected for at forbidden angles by dithering the edges of those features at the forbidden angles to reduce edge placement errors during maskless lithography patterning in a manufacturing process.

In one embodiment, a method 1000 for altering an exposure pattern is disclosed. The method 1000 may be performed by a controller 702, as shown in and discussed with relation to FIG. 7, supra. The CPU 902 is programmed to execute exposure pattern alteration software 828 stored in memory 820, which implements the method 1000 for altering an exposure pattern described in conjunction with FIG. 8, infra.

Figure 8:
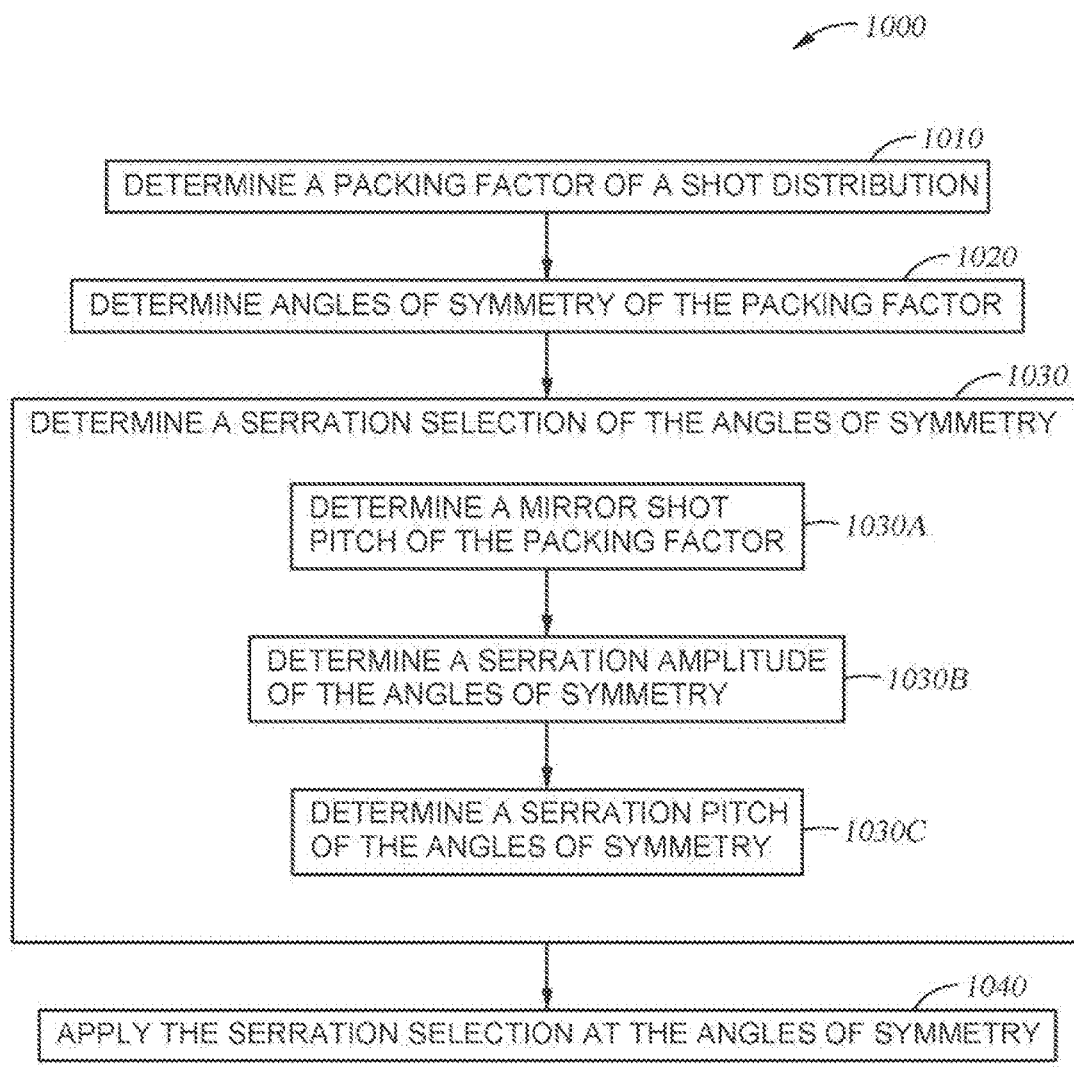
FIG. 8 schematically illustrates operations of a method for altering an exposure pattern, according to one embodiment.

FIG. 8 schematically illustrates operations of a method 1000 for altering an exposure pattern 1100, as shown in FIGS. 9A-10B. The method 1000 generally relates to an exposure pattern alteration software application which manipulates exposure polygons having lines with angles substantially close to angles of symmetry 1106 of a hex close pack arrangement, which suffer from long jogs 1104. Long jogs 1104 present themselves as regions of high edge placement error. As such, the exposure pattern alteration software application provides for line wave reduction by serrating polygon edges at affected angles to reduce edge placement errors during maskless lithography patterning in a manufacturing process.

As shots accumulate, a uniform aerial image is formed. Based on factors relating to the DMD, step size, and/or number of columns shaved, the side-wall uniformity of the exposed pattern can vary widely. Therefore, at operation 1010, a packing factor 1102 of a shot distribution is determined. The packing factor 1102 may determine an evenness of the shot distribution. An evenness of the shot distribution may include a shot landing pattern which is approximately uniform.

Testing has provided results which indicate a hex close pack (HCP) packing factor maintains a uniform shot landing pattern. In certain embodiments, a HCP packing factor maintains a packing factor 1102 of approximately two.

In some embodiments, a database of packing factors 1102 may be created. The database of packing factors 1102 may store information related to each possible angle, shot number, and/or shaving number.

Figure 9A:
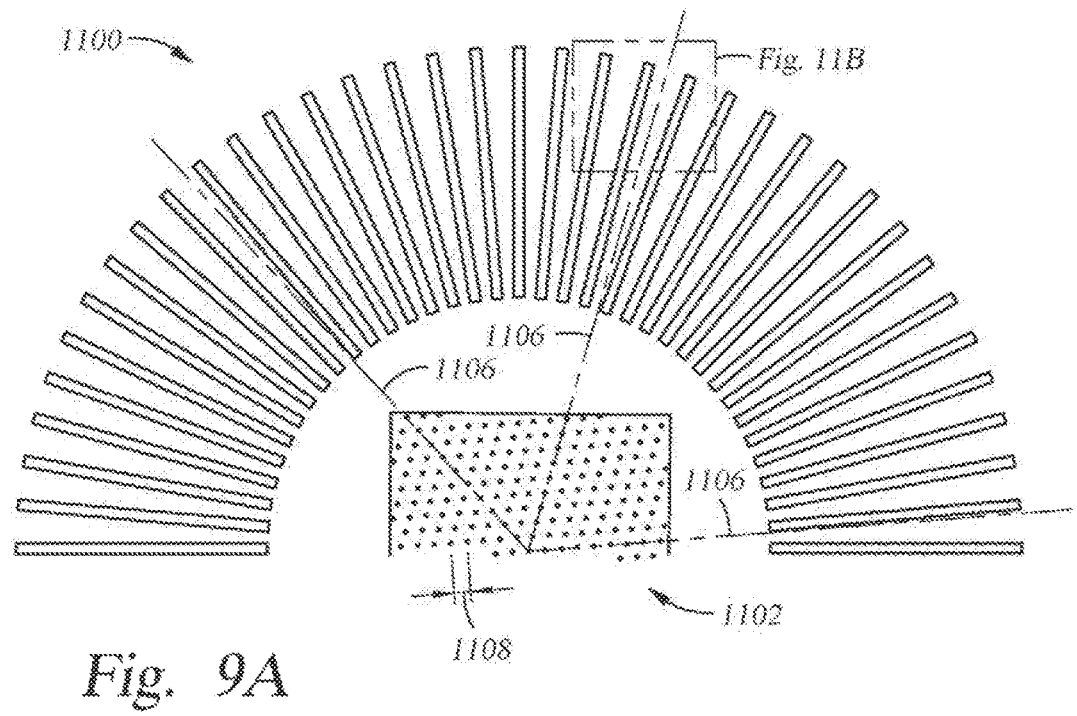
FIG. 9A schematically illustrates an exposure pattern having long jogs, according to one embodiment.
Figure 9B:
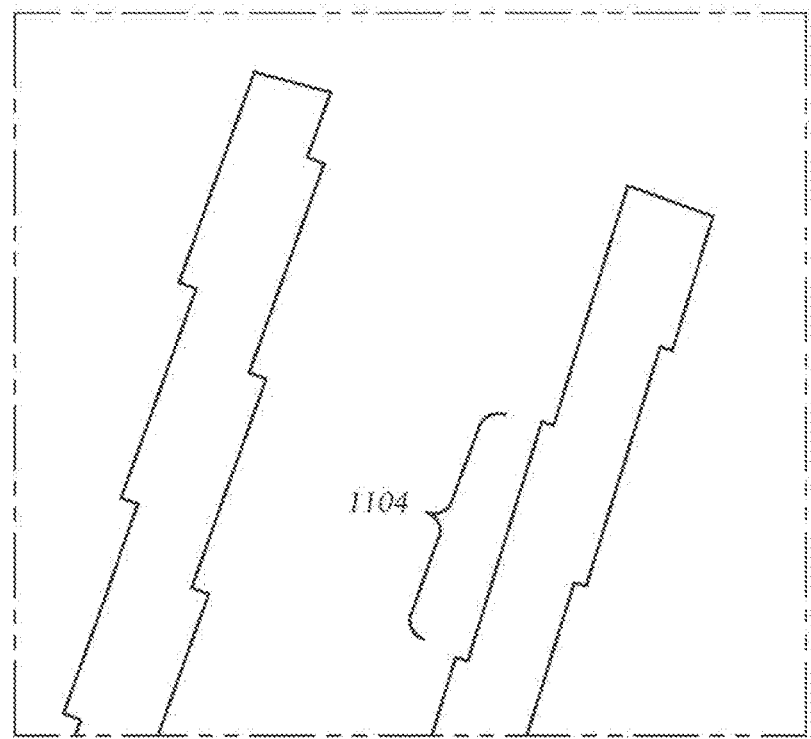
FIG. 9B schematically illustrates an enlarged view of the exposure pattern of FIG. 9A, according to one embodiment.

At operation 1020, angles of symmetry 1106 of the packing factor 1102 are determined, as shown in FIGS. 9A and 9B. In some embodiments, the angles of symmetry 1106 resulting from the HCP packing factor 1102 are determined. HCP angles of symmetry 1106 may be determined by connecting center points of individual shot landing points via imaginary lines and extending those lines to or through the exposure pattern 1100. Within the determined angles of symmetry 1106, plus or minus approximately ten degrees, for example, plus or minus six degrees, exposure polygons maintain lines with angles proximate to the HCP angles of symmetry 1106 which suffer from long jogs 1104. Long jogs 1104 are presented as regions of high edge placement error, as shown in FIG. 9B.

Testing has been performed and results indicate that, at a first tested condition, edge placement error exists at approximately −40 degrees, approximately 17 degrees, and approximately 85 degrees, with the average edge placement error reaching approximately between +/−150 nm for each, given the first tested condition. Furthermore, accounting for an error range, testing indicated that angles of symmetry for the HCP packing factor at the first test condition includes angles between about −34 degrees and about −46 degrees, between about 11 degrees and about 23 degrees, and between about 79 degrees and about 91 degrees. However, edge placement errors may occur at other degrees depending on the selected conditions. Selected conditions may include shot number, DMD angle, and/or shaving number, among others.

At operation 1030, a serration selection 1110 of the angles of symmetry 1106 is determined. Certain angles of symmetry 1106 of the shot exposure pattern may have line waving defects, thus creating the edge placement error. Applying a wave shape to the line edges of shot exposure pattern at the angles of symmetry 1106 having line waving defects compensates for and/or corrects such defects. In some embodiments, the wave shape applied may be, for example, a square wave shape or a triangular wave shape, among others. Furthermore, in some embodiments, to determine the serration selection 1110, an algorithm may search for affected angles and serrate the lines along the affected angles.

Figure 10A:
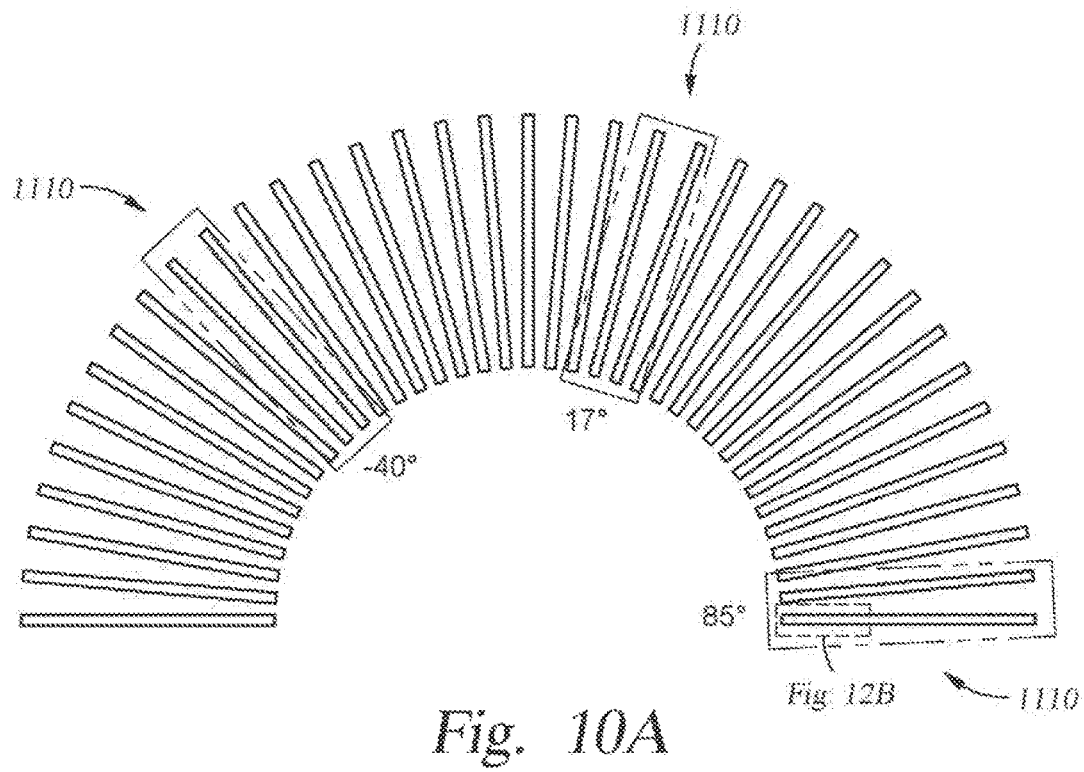
FIG. 10A schematically illustrates a serration selection applied at angles of symmetry, according to one embodiment.

As shown at operation 1030A and with reference to FIGS. 9A and 10A, determining the serration selection 1110 of the angles of symmetry 1106 includes determining a mirror shot pitch 1108 of the packing factor. Each packing factor 1102 maintains a measurable mirror shot pitch 1108, which is the distance between the center of a first mirror and a center of an adjacent second mirror, as shown in FIG. 9A. In some embodiments, mirror shot pitch 1108 for a HCP packing factor is known as the Hex Close Pack Pitch.

As shown at operation 1030B, determining the serration selection 1110 of the angles of symmetry 1106 further includes determining a serration amplitude (SA) 1112 of the angles of symmetry 1106. The serration amplitude 1112 for a HCP packing factor may be found utilizing Equation 1, as shown infra.

Testing was performed to determine the effects of serrated peak pitch and amplitude on edge placement error. N represents a value of the maximum edge placement error (peak to valley). Results indicated that N is between about 0.65 and about 0.9, for example, about 0.8, for a HCP packing factor. As such, the serration amplitude 1112 is between about 50% and about 120% of the mirror shot pitch 1108 for a hex close pack packing factor, discussed supra.

$$SA = (N)(\text{Hex Close Pack Pitch}) \qquad \text{EQUATION 1}$$

As shown at operation 1030C, determining the serration selection 1110 of the angles of symmetry 1106 further includes determining a serration pitch (SP) 1114 of the angles of symmetry 1106. The serration pitch 1114 may be found utilizing Equation 2, as shown infra.

Testing was performed to determine a ratio of the serration pitch 1114 to the mirror shot pitch 1108 for a hex close pack arrangement. Results indicated that the ratio of the serration pitch 1114 to the mirror shot pitch 1108 for a hex close pack packing factor was between about 5.0 and about 6.0, for example, about 5.5. As shown in Equation 2, the serration pitch 1114 is equal to 5.5 multiplied by the Hex Close Pack Pitch (or the mirror shot pitch 1108).

$$SP = (\text{Mirror Shot Pitch}) * 5.5 \qquad \text{EQUATION 2}$$

Figure 10B:
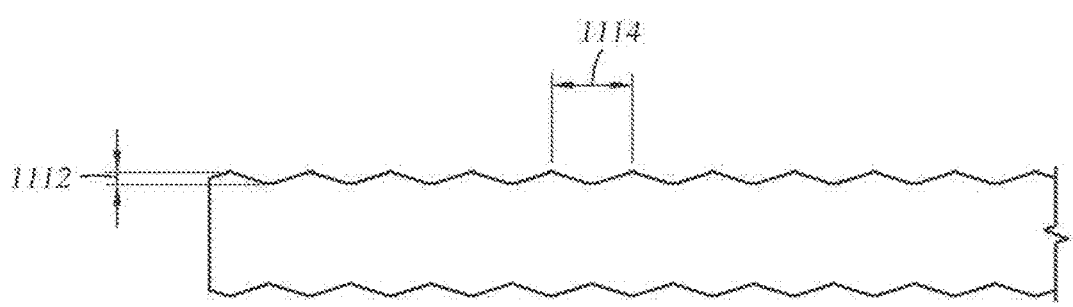
FIG. 10B schematically illustrates an enlarged view of the serration selection of FIG. 10A, according to one embodiment.

At operation 1040, the serration selection 1110 is applied at the angles of symmetry 1106, as shown in FIGS. 10A and 10B. In some embodiments, the serration selection 1110 may be applied to a substrate. In certain embodiments, the serration selection 1110 may be applied prior to or after the exposure pattern has been formed. The serration selection 1110 may comprise a polygon having at least one curved edge, such as wave shape. As discussed supra, the wave shape may include a square wave shape, a triangular wave shape, a curved wave shape, or any other polygonal shape having at least one curved edge.

In some embodiments, the method 1000 may further include exposing a pattern with the serration selection 1110 applied thereon. The pattern may be exposed on a substrate comprising the serration selection 1110. As such, the serration amplitude 1112 of the angles of symmetry 1106 and the serration pitch 1114 of the angles of symmetry 1106 are applied to the exposure pattern 1100 to provide an exposure pattern 1100 comprising the serration selection 1110. Application of the serration selection 1110 to the exposure pattern 1100 at the angles of symmetry 1106 alters the polygon edges produced in the exposure pattern 1100. Moreover, further testing indicated that edge placement error is reduced by at least 50% upon application of the serration selection 1110 at the angles of symmetry 1106.

In summation, the embodiments disclosed herein relate to an exposure pattern alteration software application which manipulates exposure polygons having lines with angles substantially close to angles of symmetry of a hex close pack arrangement, which suffer from long jogs. Long jogs present themselves as high edge placement error regions. As such, the exposure pattern alteration software application provides for line wave reduction by serrating polygon edges at affected angles to reduce edge placement errors during maskless lithography patterning in a manufacturing process.

In further summation, when a feature is exposed (e.g., a line) and said feature is slightly non-parallel to the grid or pattern (i.e., either parallel to the row or a column, as the case may be) of the landing places of all the shots that accumulate on the substrate, the exposure feature may exhibit waviness. Reasons for the exhibited waviness may include grid snapping. As such, in certain embodiments, a software check may be performed to determine whether the exposure pattern is in compliance with the design rules, and as such, may flag a user if the exposure pattern is not optimal and/or should be changed.

While the foregoing is directed to embodiments described herein, other and further embodiments may be devised without departing from the basic scope thereof. For example, aspects of the present disclosure may be implemented in hardware or software or in a combination of hardware and software. One embodiment described herein may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (for example, read-only memory devices within a computer such as CD-ROM disks readable by a CD-ROM drive, flash memory, ROM chips or any type of solid-state non-volatile semiconductor memory) on which information is permanently stored; and (ii) writable storage media (for example, floppy disks within a diskette drive or hard-disk drive or any type of solid-state random-access semiconductor memory) on which alterable information is stored. Such computer-readable storage media, when carrying computer-readable instructions that direct the functions of the disclosed embodiments, are embodiments of the present disclosure.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A method for altering an exposure pattern, comprising:
   determining a packing factor of a shot distribution;
   determining angles of symmetry of the packing factor;
   determining a serration selection of the angles of symmetry; and
   applying the serration selection to the exposure pattern.

2. The method of claim 1, further comprising:
   exposing a pattern with the serration selection thereon.

3. The method of claim 1, wherein the packing factor is a hex close pack packing factor.

4. The method of claim 1, wherein the serration selection comprises a square wave shape or a triangle wave shape.

5. The method of claim 1, wherein the serration selection comprises a polygon.

6. The method of claim 1, wherein the determining the serration selection comprises determining a serration pitch of the angles of symmetry and determining a mirror shot pitch of the packing factor, and wherein a ratio of the serration pitch to the mirror shot pitch is between about 3.0 and about 8.0.

7. The method of claim 1, wherein the determining the serration selection comprises determining a serration amplitude of the angles of symmetry and determining a mirror shot pitch of the packing factor, and wherein the serration amplitude is between about 50% and about 120% of the mirror shot pitch.

8. A computer system for altering an exposure pattern, comprising:
   a processor; and
   a memory storing instructions that, when executed by the processor, cause the computer system to:
      determine a packing factor of a shot distribution;
      determine angles of symmetry of the packing factor;
      determine a serration selection of the angles of symmetry; and
      apply the serration selection to the exposure pattern.

9. The computer system of claim 8, further comprising:
   exposing a pattern with the serration selection thereon.

10. The computer system of claim 8, wherein the packing factor is a hex close pack packing factor.

11. The computer system of claim 8, wherein the serration selection comprises a square wave shape or a triangle wave shape.

12. The computer system of claim 8, wherein the serration selection comprises a polygon.

13. The computer system of claim 8, wherein the determine the serration selection comprises determining a serration pitch of the angles of symmetry and determining a mirror shot pitch of the packing factor, and wherein a ratio of the serration pitch to the mirror shot pitch is between about 3.0 and about 8.0.

14. The computer system of claim 8, wherein the determine the serration selection comprises determining a serration amplitude of the angles of symmetry, and determining a mirror shot pitch of the packing factor, and wherein the serration amplitude is between about 50% and about 120% of the mirror shot pitch.

15. A non-transitory computer-readable medium storing instructions that, when executed by a processor, cause a computer system to alter an exposure pattern, by performing the steps of:
   determining a packing factor of a shot distribution;
   determining angles of symmetry of the packing factor;
   determining a serration selection of the angles of symmetry; and
   applying the serration selection to the exposure pattern.

16. The non-transitory computer-readable medium of claim 15, further comprising:
   exposing a pattern with the serration selection thereon.

17. The non-transitory computer-readable medium of claim 15, wherein the packing factor is a hex close pack packing factor.

18. The non-transitory computer-readable medium of claim 15, wherein the serration selection comprises a square wave shape or a triangle wave shape.

19. The non-transitory computer-readable medium of claim 15, wherein the serration selection comprises a polygon.

20. The non-transitory computer-readable medium of claim 15, wherein the determine the serration selection comprises determining a serration pitch of the angles of symmetry, determining a mirror shot pitch of the packing factor, and determining a serration amplitude of the angles of symmetry, and wherein a ratio of the serration pitch to the mirror shot pitch is between about 3.0 and about 8.0, and wherein the serration amplitude is between about 50% and about 120% of the mirror shot pitch.

* * * * *